(12) United States Patent
Hung et al.

(10) Patent No.: US 7,463,869 B2
(45) Date of Patent: Dec. 9, 2008

(54) LOW NOISE HIGH ISOLATION TRANSMIT BUFFER GAIN CONTROL MECHANISM

(75) Inventors: Chih-Ming Hung, McKinney, TX (US); Francis P. Cruise, Dallas, TX (US); Dirk Leipold, Plano, TX (US); Robert B. Staszewski, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 426 days.

(21) Appl. No.: 11/115,815

(22) Filed: Apr. 26, 2005

(65) Prior Publication Data

US 2005/0287967 A1 Dec. 29, 2005

Related U.S. Application Data

(60) Provisional application No. 60/601,586, filed on Aug. 12, 2004, provisional application No. 60/583,713, filed on Jun. 29, 2004.

(51) Int. Cl.
*H04B 1/04* (2006.01)
(52) U.S. Cl. .............. 455/127.2; 455/180.3; 455/240.1; 455/260; 375/308; 375/297
(58) Field of Classification Search .............. 455/127.2, 455/180.3, 240.1, 260; 375/308, 297
See application file for complete search history.

(56) References Cited

U.S. PATENT DOCUMENTS 6,163,178 A * 12/2000 Stark et al. .................. 327/108
6,329,836 B1 * 12/2001 Drost et al. .................. 326/30
6,631,338 B2 * 10/2003 To et al. ...................... 702/107
6,924,681 B2 * 8/2005 Staszewski et al. ......... 327/172
2005/0271161 A1 * 12/2005 Staszewki et al. ........... 375/308

* cited by examiner

*Primary Examiner*—Sanh D Phu
(74) *Attorney, Agent, or Firm*—Ronald O. Neerings; Wade James Brady, III; Frederick J. Telecky, Jr.

(57) ABSTRACT

A novel apparatus for a low noise, high isolation, all digital transmit buffer gain control mechanism. The gain control scheme is presented in the context of an all digital direct digital-to-RF amplitude converter (DRAC), which efficiently combines the traditional transmit chain functions of upconversion, I and Q combining, D/A conversion, filtering, buffering and RF output amplitude control into a single circuit. The transmit buffer is constructed as an array of NMOS switches. The control logic for each NMOS switch comprises a pass-gate type AND gate whose inputs are the phase modulated output of an all digital PLL and the amplitude control word from a digital control block. Power control is accomplished by recognizing the impairments suffered by a pseudo class E pre-power amplifier (PPA) when implemented in a CMOS process. Firstly, the NMOS switches of the array have significant on resistance and thus can only draw a limited current from the an RF choke when the input waveform is high. The significant on resistance of the NMOS switches is exploited in the DRAC circuit to introduce power control of the transmitted waveform and permits a fully digital method of controlling the RF output power.

49 Claims, 6 Drawing Sheets

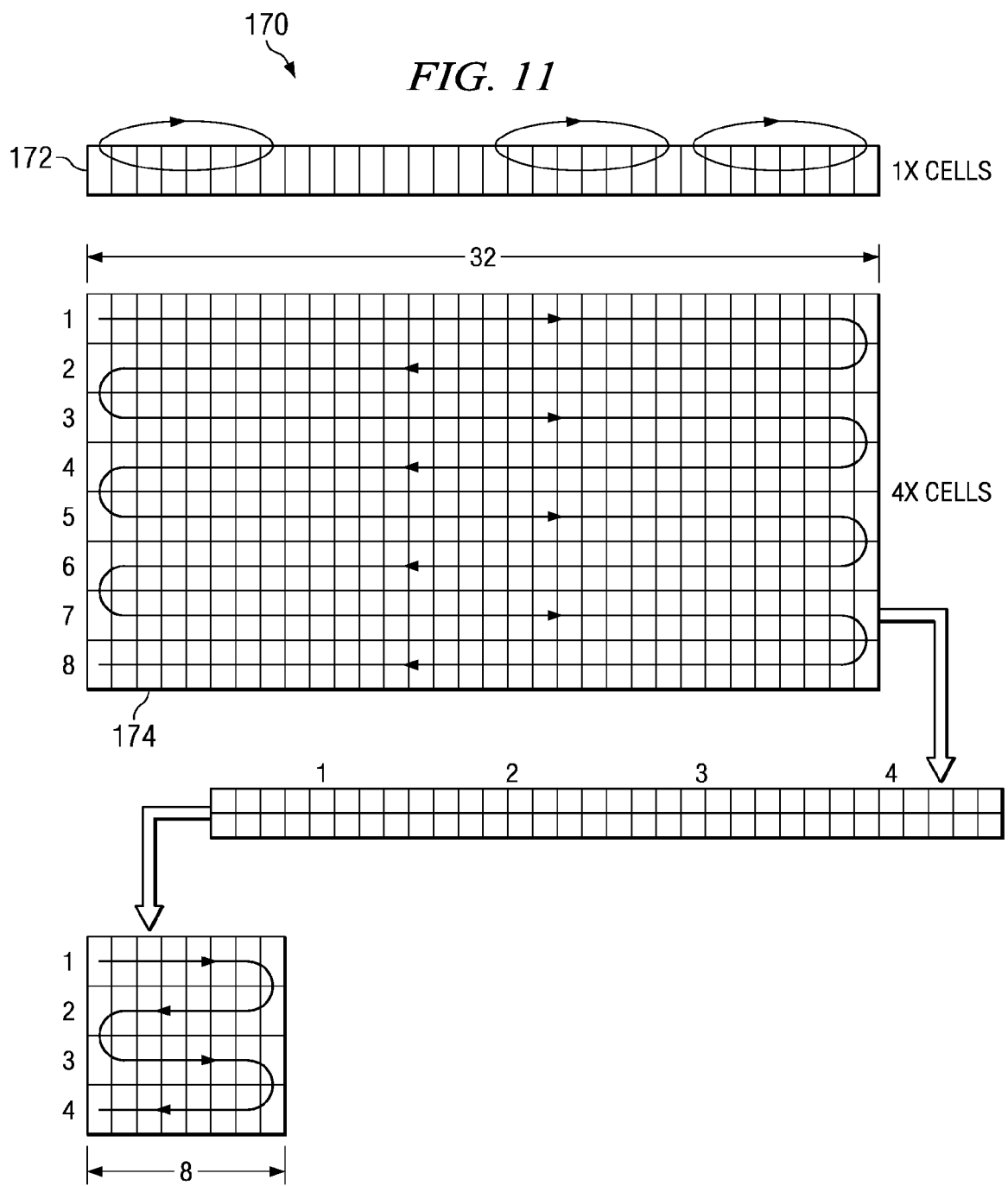

LOW NOISE HIGH ISOLATION TRANSMIT BUFFER GAIN CONTROL MECHANISM

REFERENCE TO RELATED APPLICATIONS

This application claims priority to U.S. Provisional Application Ser. No. 60/583,713, filed Jun. 29, 2004, entitled "Low Noise, High Isolation Gain Control Scheme for a Transmit Buffer" and to U.S. Provisional Application Ser. No. 60/601,586, filed Aug. 12, 2004, entitled "Low Noise, High Isolation Gain Control Scheme for a Transmit Buffer", both of which are incorporated herein by reference in their entirety.

FIELD OF THE INVENTION

The present invention relates to the field of data communications and more particularly relates to a low noise and high isolation transmit buffer gain control mechanism as incorporated in a digital to radio frequency (RF) amplitude converter (DRAC).

BACKGROUND OF THE INVENTION

It is well known in the communication arts that a transmit (Tx) buffer is required for both wired and wireless communications systems to interface the transmit path signal to the outside environment. In many cases, the transmit buffer is required to apply a variable gain to the transmit signal in order to increase or reduce the amplitude of the output signal. One such case occurs when the transmitted signal is part of an amplitude modulated communication system and the transmit buffer itself is used to implement the amplitude modulation function. The signal to noise ratio (SNR) requirements of such Tx buffers in most systems are extremely strict, meaning that any amplitude control circuitry should contribute no more than negligible noise to the buffer output. The reverse isolation (which can also be considered gain accuracy at low gain levels) of such transmit buffers is also an important concern. In addition, the current consumption requirements for these transmit buffers is limited such that any gain control scheme cannot 'burn' or waste current in order to meet the power consumption budget and the strict signal to noise requirements stated above.

A prior art digitally controlled near class E power amplifier designed for the Bluetooth wireless communication standard provides a limited number of bits for amplitude control (e.g., only 3.5 bits of amplitude control) and is used for power regulation of the transmitted constant envelope RF output. The previous lowest reported power consumption for a prior art GSM transmit chain, having no power control, is 17 mW with −7 dBm output power. The design for such a system has a transmitted power efficiency of 2.7% for an output power of 0 dBm.

There exist in the prior art multiple transmit chain architectures for transforming a digitally encoded bit stream into an RF modulated waveform at a power level suitable for transmission. The transmit power level for a cellular transceiver integrated circuit (IC) is typically around 3 dBm for interfacing with external power amplifiers (PAs). This output power level, however, is not constant in amplitude-modulated standards, such as EDGE, and must be controlled with appropriate variable-gain circuitry. Typical prior art architectures, such as single-sideband upconversion, perform digital-to-analog conversion on-chip and employ a variable gain pre-power amplifier (PPA) to transmit the required signal at the desired power level. In these architectures, the overall power consumption of the transmit chain, including all the D/A and variable gain buffer components, is at least 50 mW which is a relatively high amount of power. It is desirable to be able to reduce the power consumption of the transmit chain significantly.

As more and more communication systems incorporate increasingly complex system on chip (SoC) products which, the requirements for a gain control scheme to be used in a transmit buffer become more and more stringent. In particular, the gain control scheme is required to be robust in terms of (1) process variation insensitivity, (2) ground and substrate noise rejection and (3) ease of implementation. There is thus a long felt need for a gain control scheme for a transmit buffer that (1) can accept a digital input and output an analog output without requiring a large D/A converter (2) adds negligible noise to the output of the transmit buffer, (3) has high reverse isolation and hence good gain accuracy, (4) requires little or no quiescent current and (5) is simple to implement and is robust.

SUMMARY OF THE INVENTION

The present invention provides a solution to the problems of the prior art by providing an apparatus for a low noise, high isolation gain control scheme for a transmit buffer. The gain control scheme is presented in the context of an all digital direct digital-to-RF amplitude converter (DRAC), which efficiently combines the traditional transmit chain functions of upconversion, I and Q combining, D/A conversion, filtering, buffering and RF output amplitude control into a single circuit.

The present invention is an all digital transmit buffer having digital control and exhibiting a low noise floor. The transmit buffer is constructed as an array of NMOS switches. The control logic for each NMOS switch comprises a pass-gate type AND gate whose inputs are the phase modulated output of an all-digital PLL and the amplitude control word from a digital control block. Power control is accomplished by recognizing the impairments suffered by a pseudo class E pre-power amplifier (PPA) when implemented in a CMOS process. Firstly, the NMOS switches of the array have significant on resistance and thus can only draw a limited current from the RF choke when the input waveform is high. The significant on resistance of the NMOS switches is exploited in the DRAC circuit to introduce power control of the transmitted waveform and permits a fully digital method of controlling the output power. The number of switches on at any one time determines the amplitude of the output signal.

Use of an array of parallel NMOS switches provides control of the effective switch size. Thus, by using a portion of the array, arbitrary output power levels below the maximum output power can be achieved. Power control in this manner, however, is highly nonlinear and pre-distortion is employed in the digital control block to compensate this nonlinearity such that the final transmitted RF output signal meets the spectral requirements for the particular wireless standard used.

Increasing the switch resistance, however, causes the efficiency of the DRAC circuit to degrade with output power. The power consumption of the entire transmit chain, however, scales with the transmitted power due to the reduced load on the transmit chain buffer and reduced power consumption in the DRAC circuit itself. This is in contrast to a prior art analog buffer architecture whose power consumption does not scale significantly with the transmitted power.

The gain control scheme and transmit buffer of the present invention has several advantages including: (1) adds negligible noise to the output of the Tx buffer (2) has high reverse isolation and hence (3) good gain accuracy (4) requires no quiescent current (i.e. consumes no DC current unlike analog buffers which consume substantial quiescent current) (5) is simple to implement in an all digital circuit and is robust.

Note that many aspects of the invention described herein may be constructed as software objects that are executed in embedded devices as firmware, software objects that are executed as part of a software application on either an embedded or non-embedded computer system such as a digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the invention, a gain control apparatus for use in a transmit buffer, comprising a plurality of N output devices arranged in a parallel array and adapted to generate a radio frequency (RF) output signal, a plurality of N gates coupled to the N output devices, each gate associated with one of the output devices, each gate adapted to perform an AND function of a transmit chain signal and one bit of an N-bit amplitude control word and wherein N is a positive integer.

There is also provided in accordance with the invention, a digital to radio frequency (RF) amplitude converter apparatus comprising a plurality of N switches, each switch having an input and an output, the switches adapted to generate an RF output signal, a plurality of N AND gates, each gate having a first input, second input and an output, wherein each switch having one of the gates associated therewith, the first input of each gate coupled to an input signal and the output of each gate coupled to the input of a respective switch associated therewith, a plurality of N amplitude control signals, wherein the second input of each gate coupled to respective one of the amplitude control signals and wherein N is a positive integer.

There is further provided in accordance with the invention, a transmit buffer comprising a plurality of N output devices arranged in a parallel array, a plurality of N pass-gates coupled to the N output devices, each pass-gate associated with one of the output devices, each pass-gate adapted to perform an AND function of a transmit chain signal and one bit of an N-bit amplitude control word, a matching network coupled to the output of each the output device and adapted to generate a radio frequency (RF) output signal having amplitude determined in accordance with the amplitude control word and wherein N is a positive integer.

There is also provided in accordance with the invention, a transmit buffer comprising an array of N parallel metal oxide semiconductor (MOS) devices, each MOS device having a gate, drain and source, the array adapted to generate a radio frequency (RF) output signal, a plurality of N AND gates, each associated with an MOS device and adapted to perform an AND function between a transmit signal and one bit of an N-bit amplitude control word, means for controlling the number of MOS devices whose gate is active in accordance with the number of active bits of the amplitude control word, wherein the number of MOS devices whose gate is active determines the output power of the array and wherein N is a positive integer.

There is further provided in accordance with the invention, a transmit buffer comprising a controllable switch array comprising a plurality of switches and a plurality of AND gates, each AND gate associated with a switch and adapted to perform an AND function between an input clock signal and one bit of amplitude control word, the switch array operative to generate a radio frequency (RF) output signal, means for controlling the number of switches active in accordance with the number of active bits of the amplitude control word, wherein the number of switches active at any one time determines the output power of the switch array, a plurality of buffers, each buffer adapted to generate an input clock signal and wherein the switch array is partitioned into a plurality of sub-arrays, each sub-array driven by one of the buffers, wherein only buffers required for a particular code are turned on, unused buffers remaining off thus minimizing RF carrier feedthrough.

BRIEF DESCRIPTION OF THE DRAWINGS

The invention is herein described, by way of example only, with reference to the accompanying drawings, wherein:

FIG. 11 is a block diagram illustrating the switch array of the present invention incorporating a dynamic element matching technique.

DETAILED DESCRIPTION OF THE INVENTION

Notation Used Throughout

Figure 1:
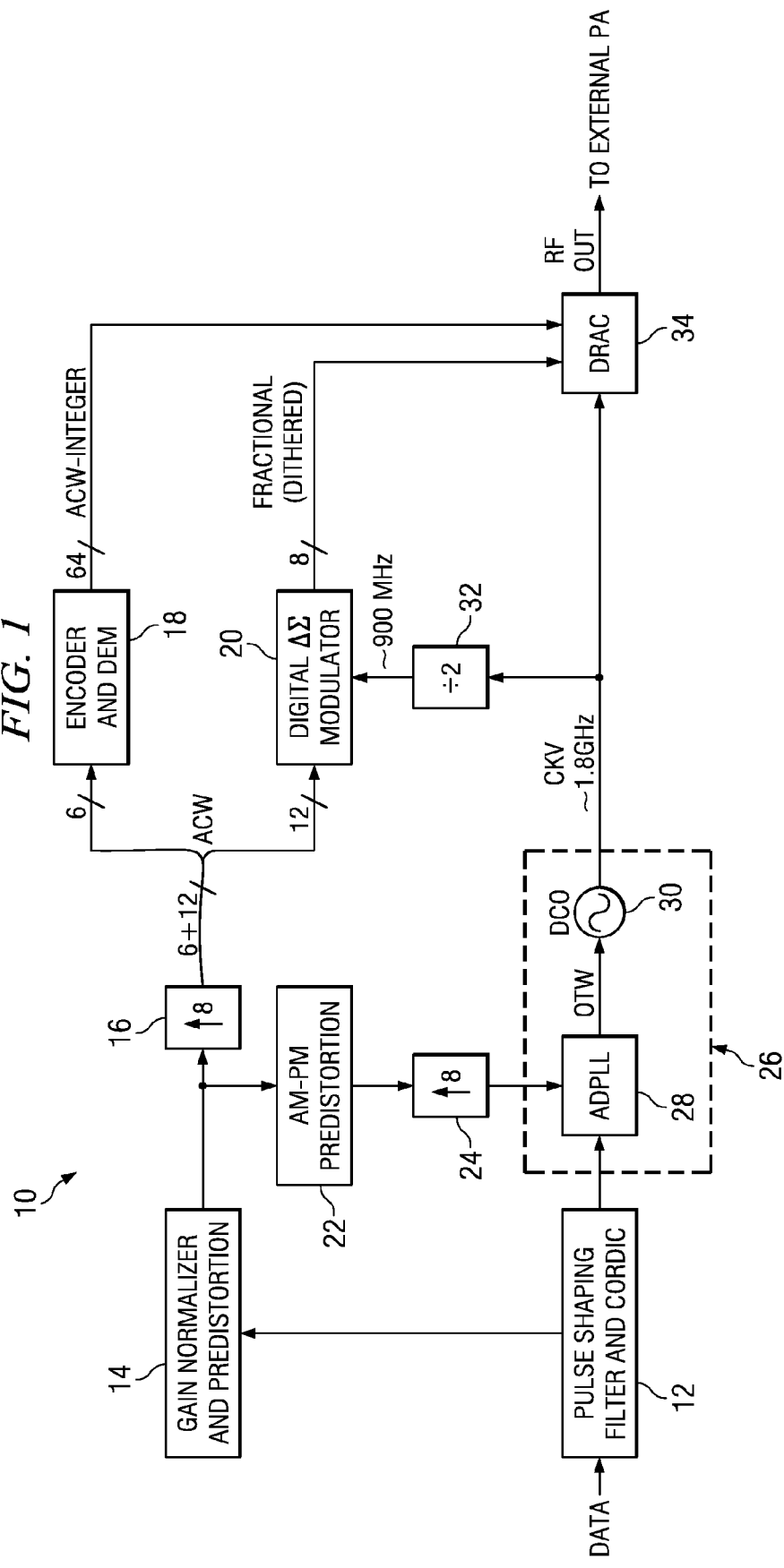
FIG. 1 is a block diagram illustrating an example embodiment of a polar transmitter and DRAC incorporating the low noise, high isolation gain control transmit buffer of the present invention.

The following notation is used throughout this document.

Term Definition
ACW Amplitude Control Word
ADPLL All Digital Phase Locked Loop
AM Amplitude Modulation
ASIC Application Specific Integrated Circuit
CDMA Code Division Multiple Access
CKR Retimed Reference Clock
CKV Variable Oscillator Clock
CMOS Complementary Metal Oxide Semiconductor
DAC Digital to Analog Converter
DCO Digital Controlled Oscillator
DEM Dynamic Element Matching
DNL Differential Non-Linearity
DRAC Digital to RF Amplitude Converter
DRP Digital RF Processor or Digital Radio Processor
DSP Digital Signal Processor
EDGE Enhanced Data rates for Global Evolution
EVM Error Vector Magnitude
FCW Frequency Command Word
FPGA Field Programmable Gate Array
FREF Frequency Reference
GSM Global System for Mobile Communication
HDL Hardware Description Language
IC Integrated Circuit
LO Local Oscillator
LSB Least Significant Bit
MOS Metal Oxide Semiconductor
NMOS n-channel Metal Oxide Semiconductor
PA Power Amplifier
PLL Phase Locked Loop
PM Phase Modulation
PMOS p-channel Metal Oxide Semiconductor
PPA Pre-Power Amplifier
RF Radio Frequency
RFC RF Choke
SNR Signal to Noise Ratio
SoC System on Chip
WCDMA Wideband Code Division Multiple Access

DETAILED DESCRIPTION OF THE INVENTION

The present invention is an apparatus for a low noise, high isolation all digital transmit buffer for use in a digital radio processor (DRP). The invention is intended for use in a digital radio transmitter and receiver but can be used in other applications as well, such as a general communication channel. The present invention provides a solution to the problems of the prior art by providing an apparatus for a low noise, high isolation gain control scheme for a transmit buffer. The gain control scheme is presented in the context of an all digital direct digital-to-RF amplitude converter (DRAC), which efficiently combines the traditional transmit chain functions of upconversion, I and Q combining, D/A conversion, filtering, buffering and RF output amplitude control into a single circuit.

To aid in understanding the principles of the present invention, the description is provided in the context of a digital to RF amplitude converter (DRAC) that serves as the final stage of an all-digital polar transmitter IC for GSM/EDGE. In one example embodiment, the circuit is constructed as an array of 64 unit-weighted transistor switches that are used to provide coarse 6-bit digital amplitude modulation. An additional array of 8 unit-weighted transistors is provided to perform high speed dithering in order to achieve fine amplitude resolution. In a GSM mode of operation, the PPA provides for precise ramp-up and ramp-down of transmit power.

It is appreciated by one skilled in the art that the gain control scheme, transmit buffer and DRAC of the present invention can be adapted to comply with numerous wireless communications standard such as GSM, extended data rate Bluetooth, WCDMA, etc. It is appreciated, however, that the invention is not limited for use with any particular communication standard (wireless or otherwise) and may be used in optical, wired and wireless applications. Further, the invention is not limited for use with a specific modulation scheme but is applicable to other amplitude modulation schemes as well.

The term transmit buffer is intended to include a transmit buffer as well as various amplifier circuits such as pre-power amplifier, low power amplifier, high power amplifier, etc. and it not intended to be limited by the amount of power produced.

The authors have constructed a DRAC incorporating the present invention in a single-chip GSM/EDGE transceiver realized in a 90 nm digital CMOS process. The DRAC implements digital RF amplitude modulation for a wireless standard involving a non-constant amplitude modulation. In this example application, the DRAC functions as a pre-power amplifier for a low power all digital GSM/EDGE based transmitter. The DRAC constructed has an efficiency of 17% at 0 dBm output power. Compared to the power efficiency of prior art schemes, this is a significant improvement in power efficiency. Further, the DRAC occupies only 0.005 mm$^2$, in comparison to well over 1 mm$^2$ for the prior art analog architectures implemented in CMOS. In addition, the static power consumption of the entire transmit chain or path is essentially zero due to its fully digital nature.

Note that throughout this document, the term communications device is defined as any apparatus or mechanism adapted to transmit, receive or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof.

A block diagram illustrating an example embodiment of a polar transmitter and DRAC incorporating the low noise, high isolation gain control transmit buffer of the present invention is shown in FIG. 1. The example application of the present invention, generally referenced 10, comprises a pulse shaping filter and cordic 12, gain normalizer and predistortion block 14, amplitude modulation/phase modulation (AM-PM) predistortion block 22, upsampling by eight 16, 24, all digital phase locked loop (ADPLL) 26 with digital logic portion 28, digitally controlled oscillator 30, encoder and dynamic element matching (DEM) block 18, digital sigma-delta modulator 20, divide by two 32 and digital to RF amplitude converter block 34. The transmit buffer gain control scheme of the present invention is incorporated in the final and merging stages of the phase and amplitude modulation paths of the transmitter 10.

The fully digital polar transmitter architecture 10 for GSM/EDGE comprises a pulse-shaping filter 12 which comprises separate I and Q filters followed by a cordic algorithm to convert the phase and amplitude outputs to the polar domain. In the example presented herein, the sampling rate is 3.25 MHz and is interpolated up to 26 MHz to further smoothen the modulating signals. The phase is differentiated to fit the frequency command word (FCW) format of the all digital PLL (ADPLL) input, which has a wideband frequency modulation capability up to half the reference frequency (FREF) of 26 MHz. A key component of the ADPLL is a digitally controlled oscillator (DCO), whose core operates at twice the 1.6 to 2.0 GHz high band frequency or four times the 0.8-1.0 GHz low band.

The amplitude output of the gain normalizer and predistortion 14 is upsampled, via block 16. In block 14 the amplitude signal is multiplied by the step size of the digital-to-RF-amplitude converter (DRAC) and is then AM-AM predistorted. The amplitude control word (ACW) is then converted to the 64-bit unit weighted format of the DRAC. A dedicated bank of 8 DRAC transistors undergoes a 900 MHz third-order $\Sigma\Delta$ modulation (similar to that performed in the DCO) in order to enhance the amplitude resolution and to achieve noise spectral shaping. The DRAC controller 18 also performs dynamic element matching (DEM) (similar to that performed in the DCO) in order to enhance time-averaged linearity. In the GSM mode of operation, a single Gaussian pulse shaping filter is used and the cordic circuit is bypassed. The AM path is temporarily engaged to ramp the output power to a desired level and remains fixed throughout the payload of the message.

Figure 2:
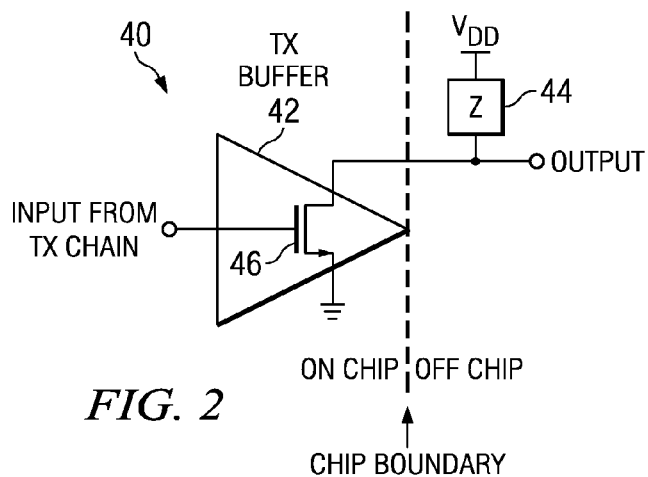
FIG. 2 is a circuit diagram illustrating a transmit buffer interfacing the transmit chain to the external environment.

A circuit schematic diagram illustrating a transmit buffer interfacing the transmit chain to the external environment is shown in FIG. 2. The transmit buffer, generally referenced 40, comprises an output device 42 having an input and output. The output device may comprise any suitable switching device but is preferably a metal oxide semiconductor (MOS) transistor having a gate, drain and source. The gate of the MOS device receives the input signal, while the drain is coupled to the output of the buffer. The source is coupled to ground (GND). The output of the buffer is coupled to the supply voltage $V_{DD}$ via load Z 44 which typically comprises an RF choke (RFC). The transmit buffer 40 functions to interface the transmit chain or path signal to the outside environment. In the example embodiments presented herein, a single MOS device is used and terminated off chip with a matching network (i.e. impedance 44) which accomplishes the final transformation of the transmitted signal to the analog domain.

The output signal amplitude in volts can be expressed as $$V_{OUT} = I_D * Z \quad (1)$$

where $V_{OUT}$ is the amplitude of the output signal;

$I_D$ is the current through the MOS device, the magnitude of which depends on the device size and the level of the signal from the transmit chain;

Z is the off chip termination impedance;

Typically the dimensions of the MOS device are selected such that the device can sink the required amount of current from the external termination to produce the appropriate $V_{OUT}$.

Figure 3:
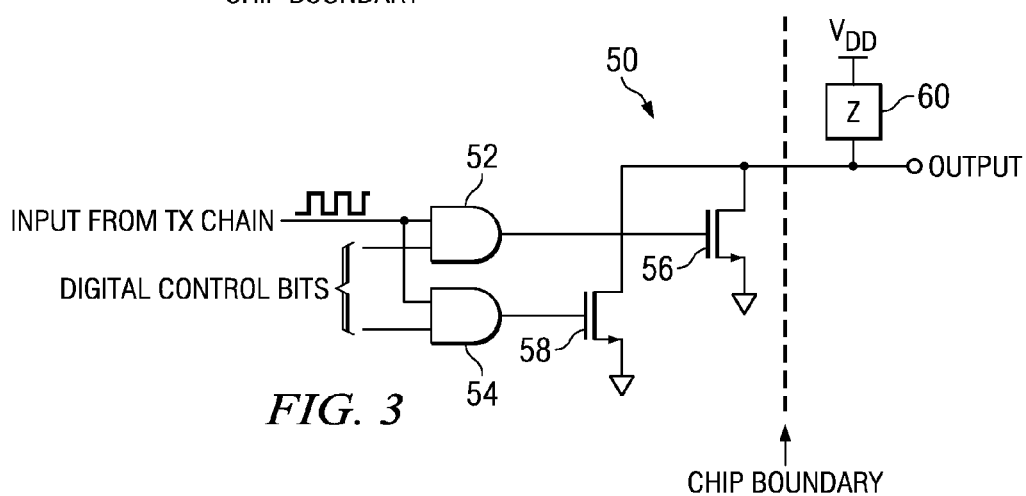
FIG. 3 is a circuit diagram illustrating a two level amplitude control scheme constructed in accordance with the present invention.

A circuit schematic diagram illustrating a three-level amplitude control scheme constructed in accordance with the present invention is shown in FIG. 3. The three-level amplitude control scheme, generally referenced 50, comprises AND gates 52, 54 with off-state, MOS output devices 56, 58 and load impedance 60. The circuit 50 illustrates a three-level amplitude control scheme whereby output amplitude can be controlled by enabling or disabling one or both of the two parallel MOS output devices 56, 58 using the AND gates 52, 54, respectively, in the following manner. The signal from the transmit chain forms one input of both AND gates, while the other input to the AND gates is either a static enable/disable signal or a series of pulses containing amplitude information of the transmit data made up of digital control bits. The output of each AND gate controls the gate of its respective output device. If the static enable signal is high, then the transmit chain signal will pass to the gate of the output device and to the output. If the static enable signal is low, the gate of the output device remains low. Thus, in accordance with the present invention, by using this scheme, the amplitude of the output signal can have N+1 levels, where N+1 is a positive integer and represents the number of parallel output devices. An N-bit amplitude control word applied to one input of each AND gate is used to control the amplitude of the output signal.

Note, however, that the use of a standard AND gate in the gain control scheme of the present invention has one major limitations associated with it: the AND gate function adds noise to the signal from the transmit chain since this signal must pass through the semiconductor devices within the AND gate itself.

Thus, in accordance with the present invention, a solution to the noise problem associated with use of a standard AND gate is presented. The AND circuit described below implements the AND function without the limitations of the standard AND gate described hereinabove.

Figure 4A:
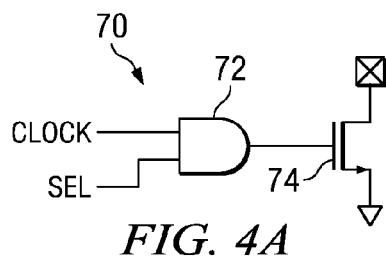
FIG. 4A is a circuit diagram illustrating a standard AND gate function adapted for use in the amplitude control mechanism of the present invention.

Four alternative circuit schemes for performing the AND gate function are described below. They include (1) standard AND gate; (2) pass-gate type AND gate; (3) cascode type AND gate; and (4) degenerated type AND gate. A circuit diagram illustrating a standard AND gate function adapted for use in the amplitude control mechanism of the present invention is shown in FIG. 4A. The AND gate, generally referenced 70, comprises a standard AND gate 72 having a clock input, select input (SEL) and an output. The output is coupled to the gate of MOS output device 74. The limitations of the standard AND gate were described supra. The clock input is the transmit chain data, the select input is the static enable/disable bit.

Figure 4B:
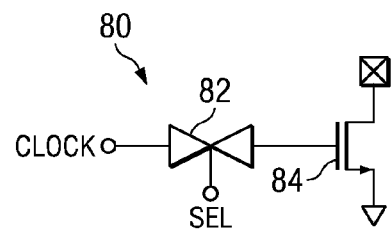
FIG. 4B is a circuit diagram illustrating a pass-gate AND gate function adapted for use in the amplitude control mechanism of the present invention.

A circuit diagram illustrating a pass-gate AND gate function adapted for use in the amplitude control mechanism of the present invention is shown in FIG. 4B. The AND gate, generally referenced 80, comprises a pass-gate type AND function 82 having a clock input, select input (SEL) and an output. The output is coupled to the gate of MOS output device 84. Pass-gate type gates are known in the art and utilize a complimentary MOS (CMOS) transmission gate controlled by the SEL signal to perform the AND function.

Figure 4C:
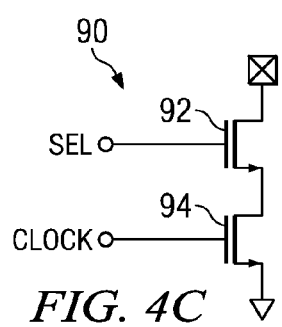
FIG. 4C is a circuit diagram illustrating a cascode AND gate function adapted for use in the amplitude control mechanism of the present invention.
Figure 4D:
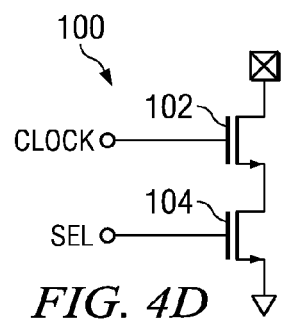
FIG. 4D is a circuit diagram illustrating a degenerated AND gate function adapted for use in the amplitude control mechanism of the present invention.

A circuit diagram illustrating a cascode AND gate function adapted for use in the amplitude control mechanism of the present invention is shown in FIG. 4C. The AND gate, generally referenced 90, comprises two MOS output devices 92, 94 coupled in totem pole fashion. The select signal (SEL) is coupled to the gate of the upper MOS output device and the clock signal is coupled to the gate of the lower MOS output device. Cascode type gates are operative to directly transform the MOS output devices into an AND gate function. Both input signals must be active for the output devices to turn on. This type of gate exhibits poor isolation because the clock signal is coupled directly to the output thus reducing the dynamic output power control range. Further, the cascode gate adds noise on its channel.

A circuit diagram illustrating a degenerated AND gate function adapted for use in the amplitude control mechanism of the present invention is shown in FIG. 4C. The AND gate, generally referenced 100, comprises two MOS output devices 102, 104 coupled in totem pole fashion. The clock is coupled to the gate of the upper MOS output device and the select signal (SEL) is coupled to the gate of the lower MOS output device. Similar to cascode type gates, degenerated type gates are operative to directly transform the MOS output devices into an AND gate function. Both input signals must be active for the output devices to turn on. This type of gate also exhibits poor isolation because the clock signal is coupled directly to the output thus reducing the dynamic output power control range. Further, the degenerated gate adds noise on its channel.

The noise performance of each of the AND gate function alternatives described hereinabove will now be discussed. A table of noise performance figures of the AND gate function alternatives, including the option of no AND gate at all) is presented below in Table 1.

TABLE 1

Noise Performance of AND Function Alternatives

| 'AND' Gate Implementation | Output Noise | Units |
|---|---|---|
| No AND gate | −168 | dBc/Hz |
| Standard AND gate | −166.2 | dBc/Hz |
| Pass-gate | −168 | dBc/Hz |
| Cascode | −165 | dBc/Hz |
| Degenerated | −168 | dBc/Hz |

Table 1 above displays the output noise of a transmit buffer implemented using different implementations of the AND gate function. For baseline comparison, the output noise level for a simple buffer such as that in FIG. 2 is shown (i.e. "No AND gate"). The metric for output noise used is the phase noise level at a 20 MHz offset from the wanted output tone. The lower the phase noise number the better the noise performance. As can be seen from the data in Table 1, the best noise performance is obtained from the pass-gate and degenerated type AND gate structures.

Figure 5A:
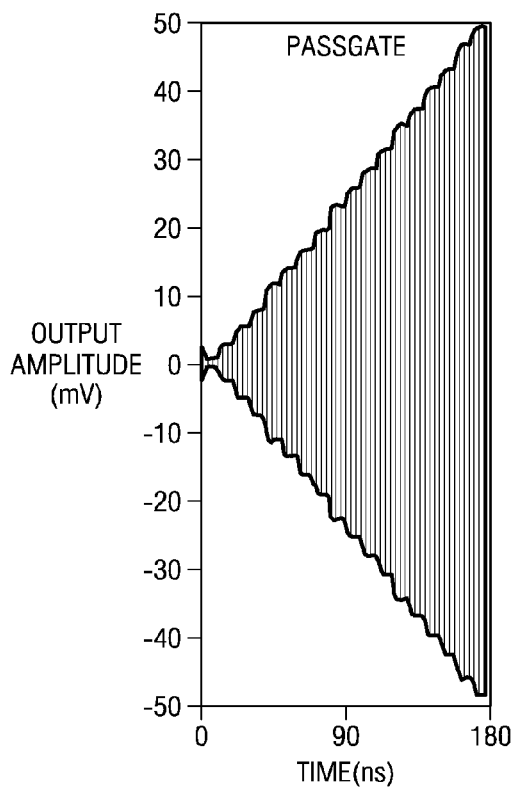
FIG. 5A is a transient response curve illustrating output amplitude versus time for the pass-gate AND function of the present invention.
Figure 5B:
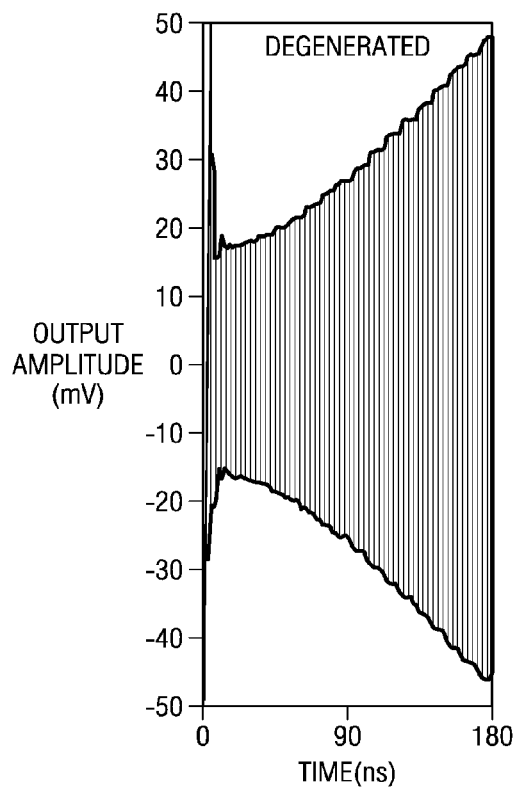
FIG. 5B is a transient response curve illustrating output amplitude versus time for the degenerated AND function.

A transient response curve illustrating output amplitude of a transmit buffer versus time for the pass-gate type AND gate function of the present invention is shown in FIG. 5A. A transient response curve illustrating output amplitude of a transmit buffer versus time for the degenerated type AND gate function is shown in FIG. 5B. In both FIGS. 5A and 5B, the output of the transmit buffer is measured over time as the amplitude control word is increased by one LSB every 10 nS. As can be seen in the output amplitude curves for both AND gate types, the output of the pass-gate type AND gate transmit buffer output exhibits an initial clock feedthrough of less than 1 mV, which means that initial amplitude control can be obtained at this resolution. The output of the degenerated type AND gate transmit buffer exhibits clock feedthrough (i.e. leakage) of 16 mV, which limits initial amplitude control to this resolution. Thus, the pass-gate type AND function is preferred and used in the present invention. The pass-gate type AND function employs a clock feedthrough isolation feature which is described in more detail infra.

Figure 6:
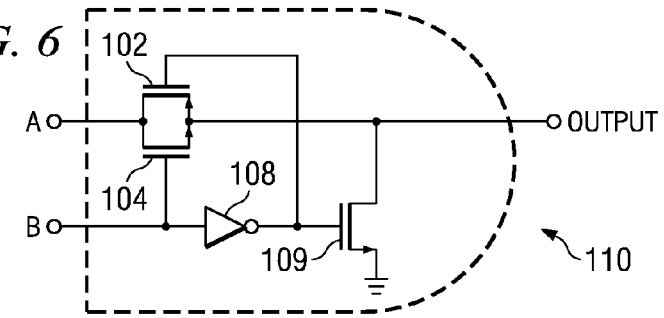
FIG. 6 is a circuit diagram illustrating the pass-gate AND function of FIG. 4B in more detail.

A circuit diagram illustrating the pass-gate AND function of FIG. 4B in more detail is shown in FIG. 6. The pass-gate type AND function circuit, generally referenced 110, comprises an PMOS transistor 102, NMOS transistors 104, isolation transistor 109 and inverter 108. In operation, the pass-gate permits very efficient implementation of simple gates and requires few transistors, with a small delay due to the single inversion level. It's advantage is that the gate structure effectively filters out noise and provides high isolation between the A input and the output and between A and B inputs. The low noise is due to the fact that the output current does not pass through the pass-gate, thus the pass-gate contributes virtually zero noise. To achieve additional isolation, the output of the pass-gate is pulled to ground through isolation transistor 109 to ensure the switch is turned off and to further reduce the signal coupling between the A input and the output.

Figure 7:
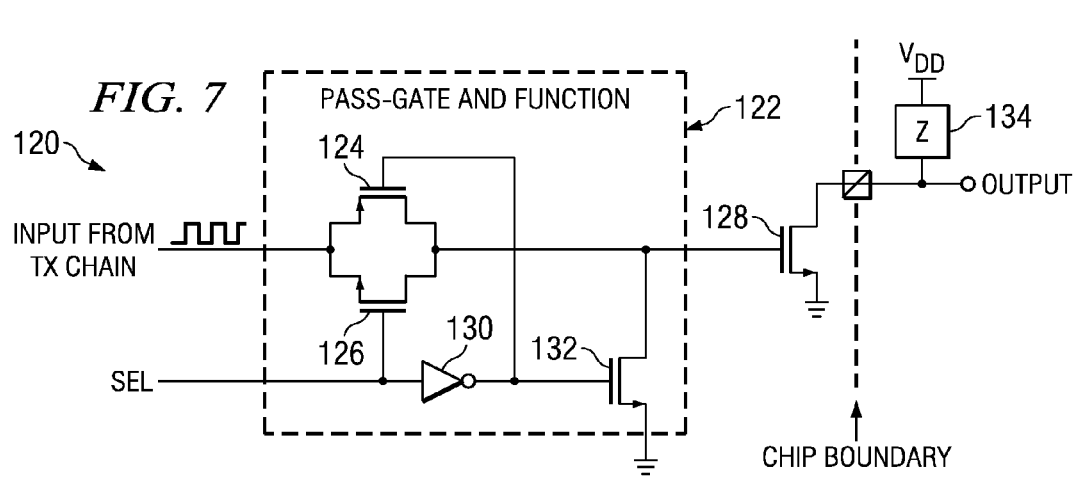
FIG. 7 is a circuit diagram illustrating an example implementation of the transmit buffer gain control mechanism of the present invention.

A circuit diagram illustrating an example implementation of the transmit buffer gain control mechanism of the present invention is shown in FIG. 7. The transmit buffer circuit, generally referenced 120, comprises a pass-gate type AND function circuit 122, isolation transistor 132, output device 128 and external load impedance 134. The pass-gate AND function circuit 122 comprises NMOS transistor 126, PMOS transistor 124, inverter 130 and isolation device 132. The output device 128 preferably comprises an NMOS transistor switch. The SEL input signal serves as the enable/disable signal for the AND gate function. The addition of the isolation device 132 significantly improves clock feedthrough by grounding the gate of the driver transistor 128 when the SEL static enable bit is low.

The transmit buffer circuit 120 can be considered a single cell of a multibit gain controllable transmit buffer. Such a gain controllable transmit buffer would comprise a plurality of N single bit cells 120 thus implementing a transmit buffer having N output power levels, controlled by an N-bit amplitude control word. Note that the pass-gate type AND gate function used in the transmit buffer cell inherently draws no quiescent current and is insensitive to process variations, being digital in nature.

Figure 8:
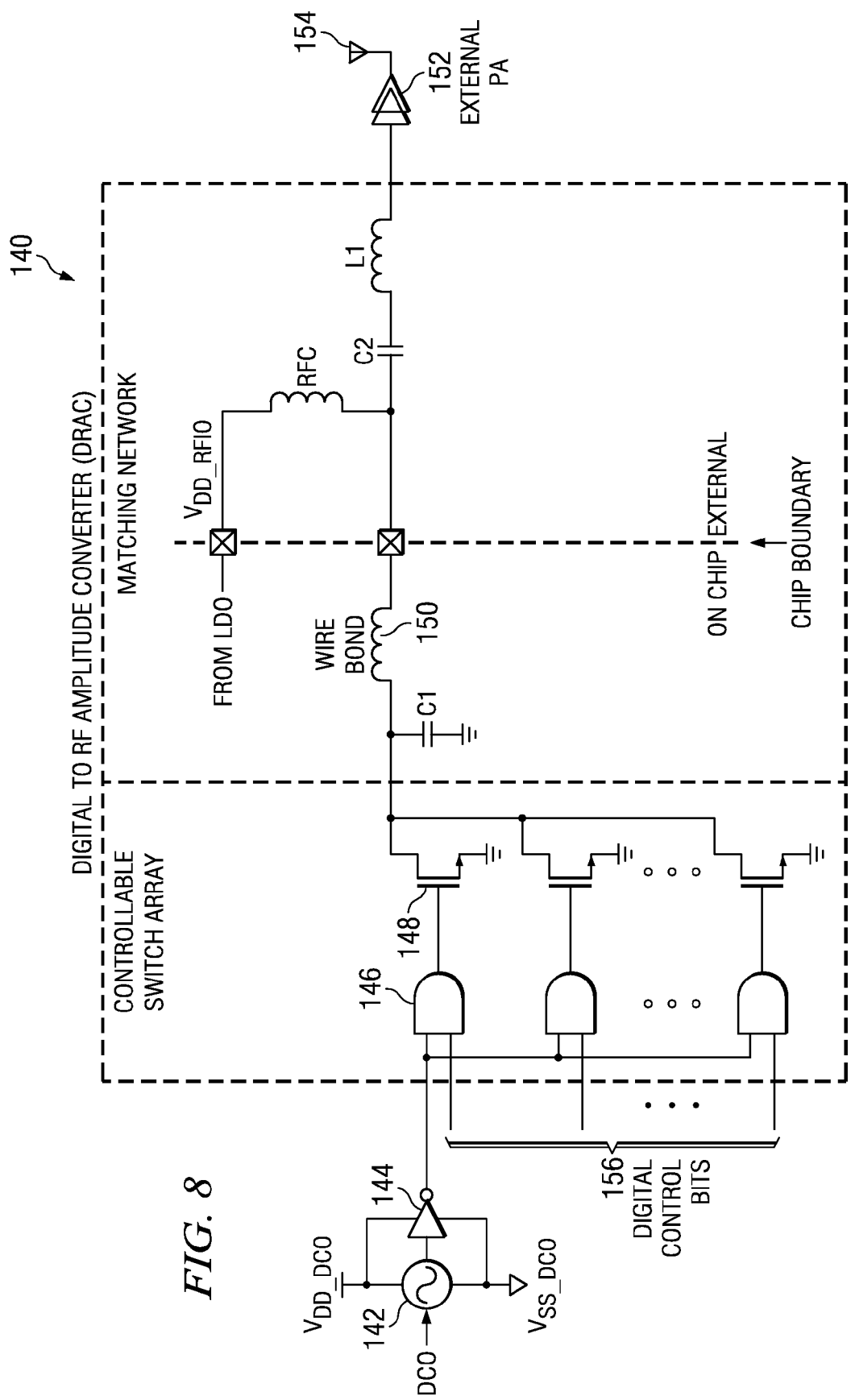
FIG. 8 is a circuit diagram illustrating the digital to RF amplitude converter (DRAC) of the present invention in more detail.

The digital to RF amplitude converter (DRAC) incorporating the transmit buffer gain control scheme of the present invention will now be described in more detail. A circuit diagram illustrating the digital to RF amplitude converter (DRAC) of the present invention in more detail is shown in FIG. 8. The DRAC, generally referenced 140, comprises a plurality of N pass-gate type AND gates 146, a plurality of N output devices 148 (NMOS devices in this example), capacitors C1, C2 and inductors 150, L1, RFC. The DRAC operates as a pseudo class E type amplifier and is driven by a transmit chain signal comprising the square wave signal output of DCO 142 (see FIG. 1) and buffer 144. Being a class E buffer, the DRAC no DC bias current is required, unlike class A, class AB, class C or class D. The square wave signal is the phase modulated signal from the all digital PLL (ADPLL) described supra and shown in FIG. 1. The N NMOS transistors are operative as on/off switches. An RF choke (RFC) functions as a bi-directional current source, connecting the NMOS switches to the on-chip supply voltage regulator ($V_{DD\_RFIO}$). The switch array is driven by a digital signal. The buffer draws current from an external matching network shown. In this manner, the buffer generates an analog voltage waveform at its output.

Capacitor C1 represents the on-chip capacitor connected in parallel to the drain terminals of each NMOS switch and includes, for analysis purposes, the equivalent capacitance over one cycle given by the non-linear CDD of the NMOS switch. The residual second harmonic of the transmit frequency is filtered by the series combination of C2 and L1, allowing the DRAC itself to remain a single-ended circuit. The remaining matching network components are selected to achieve the condition where the switch output is critically damped, such that the drain voltage is low when the output current is high and vice versa.

Furthermore, in order to preserve the gate oxide integrity of the switches 148, the voltage swing at the drain must be controlled by the matching network to satisfy $V_{eff,GOI} < 2 \cdot V_{DD}$, where $V_{eff,GOI}$ represents the equivalent DC voltage on the drain resulting from one RF cycle. This buffer circuit is ideally suited to a low voltage environment in a digital CMOS process because, unlike in class A, B and C amplifiers where the transistor acts as a current source, there is no headroom requirement on $V_{DS}$ with this structure. The only requirement is that $V_{GS}$ must be able to go higher than the threshold voltage for the transistor to turn on, which is naturally guaranteed by the input digital signal. Another advantage of this buffer circuit, implemented in a deep submicron CMOS process, is that the extra input circuitry and output filtering circuitry of class F type amplifiers is not required.

The control logic for each NMOS switch comprises a pass-gate type AND gate whose inputs are the phase modulated output of the ADPLL and the amplitude control word from a digital control block. The AND gate is implemented as a pass-gate rather than a conventional standard fully static AND gate. This has the advantage of minimizing thermal noise from the AND function which in turn reduces the ultimate broadband phase noise floor of the DRAC. As described supra, alternative implementations of the AND gate function include using a cascode (or current steering topology) or degenerative device together with the driver transistor. These approaches, however, suffer from degraded output noise performance and increased local oscillator (LO) feed through (via device parasitic capacitance) which limits the dynamic range of the DRAC, and are thus not preferred.

In the example implementation, the RF output signal generated by the DRAC circuit is subsequently input to an external power amplifier 152 where the signal is amplified to the appropriate levels in accordance with the particular wireless standard. The output of the power amplifier is input to the antenna 154 for broadcast transmission over the air. The DRAC can also be implemented with a high output-power level.

Due to a limited die area for power and ground planes, the DRAC circuit preferably operates on power and ground planes that are separate from those used by the digitally controlled oscillator (DCO) in order to reduce injection pulling or locking of the DCO when amplitude modulation is enabled. In phase only modulation mode, there is no interaction between the DRAC and the DCO since they are phase aligned and thus injection pulling or locking is not a concern.

In accordance with the present invention, power control is accomplished in the DRAC by recognizing the impairments that a pseudo class E pre-power amplifier (PPA) suffers when implemented in a CMOS process. Firstly, the NMOS switches 148 have significant on resistance and can thus only draw a limited current from the RFC when the input waveform is high. Secondly, the rise and fall times of the input digital waveform are not negligible although they are typically less than 100 ps, depending on the CMOS process. It is the significant on resistance of the switch that is exploited in the DRAC circuit to introduce power control of the transmitted waveform and permits a fully digital method of controlling the output power. Note that by reducing the effective switch size and increasing the effective 'on' impedance, the output power of the DRAC is reduced.

Figure 9A:
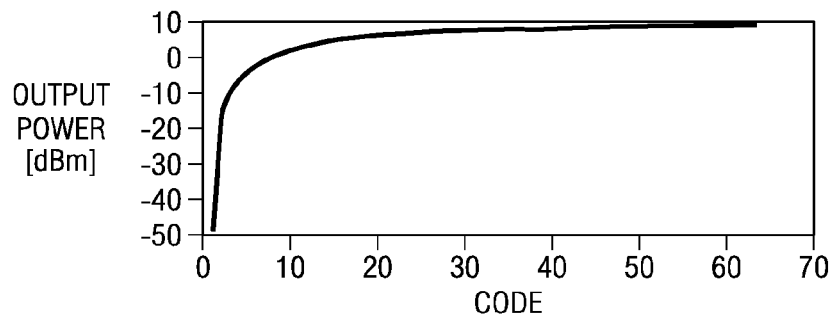
FIG. 9A is a graph illustrating output power versus the number of output devices in the transmit buffer gain control mechanism.
Figure 9B:
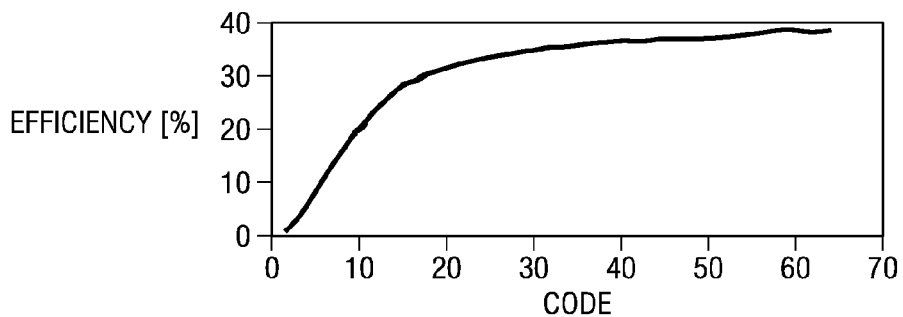
FIG. 9B is a graph illustrating efficiency versus the number of output devices in the transmit buffer gain control mechanism.

The effective switch size is controlled by using an array of parallel NMOS devices 148. Thus, by using a portion of the array, arbitrary output power levels below the maximum output power can be achieved. Power control in this manner, however, is highly nonlinear as shown in FIG. 9A which illustrates output power versus the size of the code (i.e. the number of switches in the transmit buffer gain control mechanism thus the number of effective output devices). A graph of efficiency versus code size is shown in FIG. 9B. To compensate this nonlinearity, pre-distortion is employed in the digital control block 18 (FIG. 1) such that the final transmitted RF output signal meets the spectral requirements for the particular wireless standard used.

It is important to note that a side effect of increasing the switch resistance is that the efficiency of the DRAC circuit degrades with output power, as illustrated in FIG. 9. The power consumption of the entire transmit chain, however, scales with the transmitted power due to the reduced load on the transmit chain buffer and reduced power consumption in the DRAC circuit itself. This is in contrast to a prior art analog buffer architecture whose power consumption does not scale significantly with the transmitted power.

Note that the number of bits in the amplitude control word relates to the granularity of the output power and determines the number of transistors required. The number of transistors required is related to (1) the desired resolution of the output power and (2) the desired maximum output power. Using more transistors to achieve better resolution while reducing the power per transistor (i.e. reducing the size of each transistor) helps reduce unwanted side tones.

The DRAC circuit of the present invention has been constructed as an array of carefully laid out 64 unit-weighted transistor switches that are used to provide coarse 6-bit digital amplitude modulation. An additional 12-bits of fine amplitude modulation is also provided with a separate bank of 8 unit-weighted transistors. The output power is variable from −50 dBm (2 mVpp) to +10 dBm (2 Vpp) with a linearized equivalent step size of 2 mV. The typical phase noise floor of −170 dBc/Hz at 20 MHz frequency offset, including an on-chip regulator, is below the oscillator noise floor. The low broadband noise floor of the DRAC circuit eliminates the need for an external SAW filter in the final application. The current consumption of the DRAC circuit is 6 mA at 1.4 V supply and 0 dBm output power.

The transmitter incorporating the DRAC circuit meets the GSM phase noise requirements of −162 dBc/Hz at the 20-80 MHz offset from the carrier. At 20 MHz offset phase noise of −167 dBc/Hz was measured. Beyond the 20 MHz offset the phase noise continues to decrease several dB. The EDGE error vector magnitude (EVM) specification of 9% is met with a measured value of 3.5%. The transmitted GSM and EDGE spectra also meet the requirements of the specification.

Figure 10:
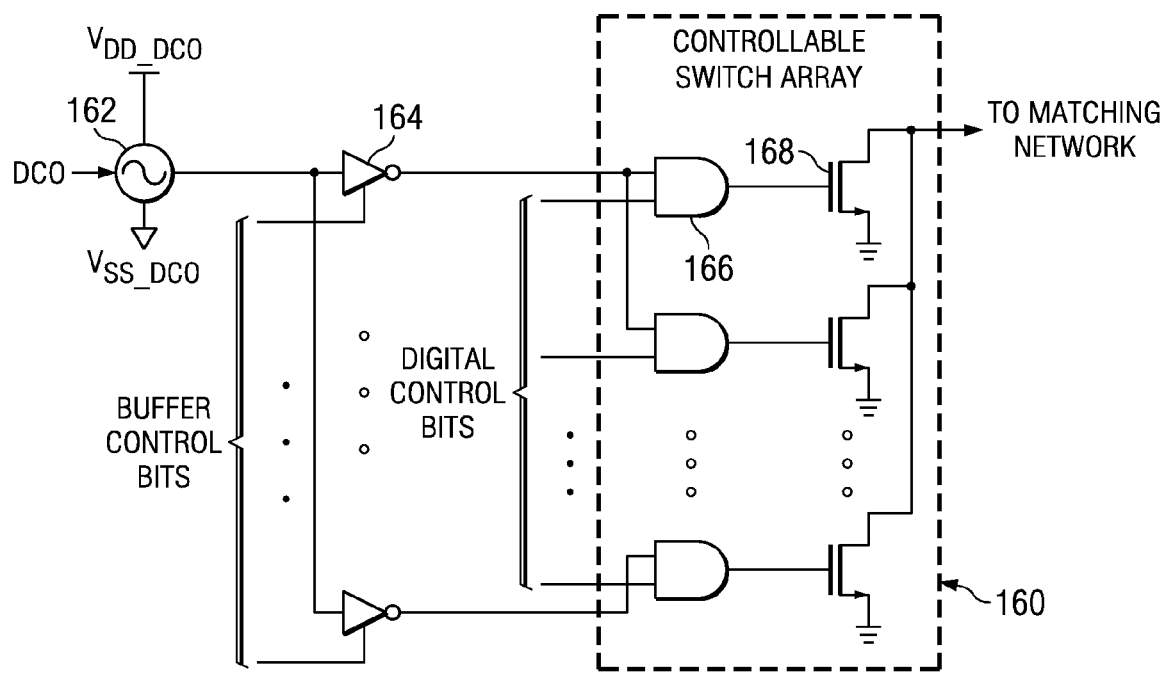
FIG. 10 is a circuit diagram illustrating the DRAC of the present invention wherein the controllable switch array is split into a plurality of sub-arrays each driven by dedicated buffer.

In accordance with the present invention, an additional reduction of the RF carrier feedthrough of the PPA can be obtained by splitting the PPA controllable switch array into a plurality of smaller arrays. A circuit diagram illustrating the DRAC of the present invention wherein the controllable switch array is split into a plurality of sub-arrays each driven by dedicated buffer is shown in FIG. 10. The controllable switch array, generally referenced 160, comprises a plurality of AND gates 166 and transistors 168. One of the inputs to the AND gates are provided by the outputs of the plurality of buffers 164 and the other input is the digital control bits output by the logic determining the output power level. The combined outputs of the transistors 168 constitutes the output of the switch array and is input to the matching network similar to that shown in FIG. 8.

In this alternative embodiment, the PPA is split into a plurality of sub-arrays. Each sub-array may include any number of transistors and is driven by a dedicated buffer from the DCO. The buffers 164 have 3-state controls or other means for shutting them down. A plurality of buffer control bits determines which buffers are on and which are off. The buffers 164 may be part of the DCO or the DRAC depending on the implementation. Splitting the PPA into multiple sub-arrays serves to significantly reduce RF carrier feedthrough, especially at low power levels. RF carrier feedthrough is reduced because only the portion of the switch array that is being used is provided an input clock. The unused portions of the array are not provided an input clock thus eliminating the source of the carrier feedthrough.

Although the PPA may be divided into any suitable manner, in a preferred embodiment, the PPA is split into binary groups (i.e. powers of 2). A binary partition achieves maximum dynamic range. Thus, considering a 1024 transistor array, ten sub-arrays are formed having 1, 2, 4, 8, 16, 32 . . . 512 transistors in each group. Other size arrays would have a higher or lower number of binary groups accordingly. Depending on the output code, only the minimum number of buffers are turned on to generate the required output amplitude. The unused buffers remain off. For low power outputs, the lack of an input clock significantly reduces the RF carrier leakage of the switch array.

In accordance with the invention, the size of each buffer is proportional to the number of transistors in its group. Thus, using the one transistor buffer as a reference, the buffer for the two transistor group is twice the size of the buffer for the one transistor group. The buffer for the 4-transistor group is 4×, the buffer for the 8-transistor group is 8× and so on. Each buffer is designed to be just large enough to provide sufficient drive to the number of transistors in its group.

If device matching is a concern, the buffers that get turned on can be shifted in accordance with the actual code to improve the differential non-linearity (DNL). For example, considering a binary partition, a code=8 can cause only the buffer for the '8' group to turn on with all bits (i.e. cells) within the group also turned on. This is in contrast to turning on the buffers for the '1', '2', '4' and '8' groups wherein all bits of '1', '2' and '4' are used but only one bit of the '8' is actually used to generate code=8 output.

Further in accordance with the present invention, a dynamic element matching scheme is provided to reduce device mismatch between adjacent codes whereby switching between adjacent transistors is performed in the actual implementation. A block diagram illustrating the switch array of the present invention incorporating a dynamic element matching technique is shown in FIG. 11. By way of example only, considering the switch array 174, increasing code values translate to additional transistors being turned on. To compensate for mismatches between transistors due to process, voltage and temperature (PVT), as the end of a row is reached, the path continues with the next row but in the opposite direction. Rather than returning to the beginning of the next row when the end of a row is reached, the next row below is traversed in the opposite direction. This results in the snake like path shown in FIG. 11.

The dynamic element matching scheme also includes means for varying the actual 1× transistor cells used to generate the output. Due to mismatches in the 1× cell row from one end to the other, the transistors used for a particular output word are varied across the row. Although only 3-bits are needed to achieve 1024 resolution, all 32-bits are cycled through in order to average out the device mismatch between the 1× transistors.

As the size of the array increases and more and more cells are added, however, the parasitic capacitance of the interconnect between each line increases (i.e. the parasitic capacitance between the clock and the output) resulting in increased leakage current. Thus, it is desirable to reduce the coupling as much as possible. A solution is to implement fewer cells for a given code length and to shut off groups of cells that are not being used (as described hereinabove).

To further improve matching between transistors, the array 174 can be divided into a plurality of sub-arrays whereby each sub-array is traversed in snake like fashion. Smaller sized portions result in better matching conditions. For example, the array 174 may be split into two sub-arrays. In this case, each sub-array is traversed by alternating the direction of travel for each successive row. Subdividing the array provides better element matching and further reduces device mismatch between adjacent codes. A point is reached, however, where too many subdivisions do not improve results since the column size becomes the dominant dimension and transistors at the top of the column are physically far from transistors at the bottom. Thus, an optimum is achieved when the sub-arrays approximate squares (i.e. the row and column dimensions are similar).

Further reduction in device mismatch can be obtained by reducing the total number of transistors thereby reducing the physical distance of transistors from each other. This can be achieved by increasing the size of the cells within the array. As an example, consider an array adapted to handle codes 0 to 1023 (i.e. 10-bits). Rather than use 1023 individual transistors, the invention uses an array of 256 (8-bit) cells where each cell is 4× the size of the individual cell. The array is organized as an 8×32 matrix. These cells are referred to as MSB cells. Three additional 1× cells 172 are provided for the 3-LSBs 1, 2 and 3. Thus, any code in the range of 0 to 1023 can be converted by using the 8-bit binary code for MSB to turn on the needed number of cells within the 256 MSB (4×) array and the 2-bit binary code for LSB to turn on the needed number of cells within the 3 LSB (1×) array. The outputs of the LSB and MSB arrays are combined to form the DRAC output.

It is appreciated that the decoding logic may be implemented using techniques well known in the digital logic arts and need not be described in detail. Further, the decoding logic may be implemented within the switch array or in the logic that generates the code, the actual location not being relevant to the invention.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A gain control apparatus for use in a transmit buffer, comprising
    a plurality of N output devices arranged in a parallel array and adapted to generate a radio frequency (RF) output signal;
    a plurality of N gates coupled to said N output devices, each gate associated with one of said output devices, each gate adapted to perform an AND function of a transmit chain signal and one bit of an N-bit amplitude control word;
    N isolation devices, each isolation device coupled to an output of one of the gates and an input of one of the output devices, said isolation device adapted to minimize coupling of said transmit chain signal to the RF output signal for output devices in an off state; and
    wherein N is a positive integer.

2. The apparatus according to claim 1, wherein each said output device comprises a semiconductor device.

3. The apparatus according to claim 1, wherein each said output device comprises a metal oxide semiconductor (MOS) device having a gate, drain and source, the output of each gate coupled to the gate of an MOS device.

4. The apparatus according to claim 1, wherein each said output device comprises a switching device.

5. A gain control apparatus for use in a transmit buffer, comprising:
   a plurality of N output devices arranged in a parallel array and adapted to generate a radio frequency (RF) output signal;
   a plurality of N gates coupled to said N output devices, each gate associated with one of said output devices, each gate adapted to perform an AND function of a transmit chain signal and one bit of an N-bit amplitude control word; and
   wherein N is a positive integer and wherein each gate comprises a low noise, high isolation pass-gate type AND gate.

6. A gain control apparatus for use in a transmit buffer, comprising:
   a plurality of N output devices arranged in a parallel array and adapted to generate a radio frequency (RF) output signal;
   a plurality of N gates coupled to said N output devices, each gate associated with one of said output devices, each gate adapted to perform an AND function of a transmit chain signal and one bit of an N-bit amplitude control word; and
   wherein N equals 64.

7. A gain control apparatus for use in a transmit buffer, comprising:
   a plurality of N output devices arranged in a parallel array and adapted to generate a radio frequency (RF) output signal;
   a plurality of N gates coupled to said N output devices, each gate associated with one of said output devices, each gate adapted to perform an AND function of a transmit chain signal and one bit of an N-bit amplitude control word; and
   wherein N equals 1024.

8. A gain control apparatus for use in a transmit buffer, comprising:
   a plurality of N output devices arranged in a parallel array and adapted to generate a radio frequency (RF) output signal;
   a plurality of N gates coupled to said N output devices, each gate associated with one of said output devices, each gate adapted to perform an AND function of a transmit chain signal and one bit of an N-bit amplitude control word; and
   wherein N is a positive integer and wherein said amplitude control word is adapted to apply predistortion, filtering and amplitude modulation to said input signal.

9. The apparatus according to claim 1, further comprising a matching network having an input and an output, the output of said parallel array of output devices input to said input of said matching network.

10. A gain control apparatus for use in a transmit buffer, comprising:
   a plurality of N output devices arranged in a parallel array and adapted to generate a radio frequency (RF) output signal;
   a plurality of N gates coupled to said N output devices, each gate associated with one of said output devices, each gate adapted to perform an AND function of a transmit chain signal and one bit of an N-bit amplitude control word, wherein N is a positive integer;
   a matching network having an input and an output, the output of said parallel array of output devices input to said input of said matching network; and
   wherein said output of said matching network is coupled to an external power amplifier and antenna.

11. The apparatus according to claim 1, adapted to be implemented in an Application Specific Integrated Circuit (ASIC).

12. The apparatus according to claim 1, adapted to be implemented in a Field Programmable Gate Array (FPGA).

13. A digital to radio frequency (RF) amplitude converter apparatus, comprising:
   a plurality of N switches, each switch having an input and an output, said switches adapted to generate an RF output signal;
   a plurality of N AND gates, each gate having a first input, second input and an output, wherein each switch having one of said gates associated therewith, the first input of each gate coupled to an input signal and the output of each gate coupled to the input of a respective switch associated therewith;
   a plurality of N amplitude control signals, wherein the second input of each gate coupled to respective one of said amplitude control signals;
   N isolation devices, each isolation device coupled to an output of one of the gates and an input of one of the switches, said isolation device adapted to minimize coupling of said input signal to the RF output signal for switches in an off state; and
   wherein N is a positive integer.

14. The apparatus according to claim 13, wherein each said switch comprises a semiconductor device.

15. The apparatus according to claim 13, wherein each said switch comprises a metal oxide semiconductor (MOS) device having a gate, drain and source, the output of each gate coupled to the gate of an MOS device.

16. A digital to radio frequency (RF) amplitude converter apparatus, comprising:
   a plurality of N switches, each switch having an input and an output, said switches adapted to generate an RF output signal;
   a plurality of N AND gates, each gate having a first input, second input and an output, wherein each switch having one of said gates associated therewith, the first input of each gate coupled to an input signal and the output of each gate coupled to the input of a respective switch associated therewith;
   a plurality of N amplitude control signals, wherein the second input of each gate coupled to a respective one of said amplitude control signals; and
   wherein N is a positive integer and wherein each gate comprises a low noise, high isolation pass-gate type AND gate.

17. A digital to radio frequency (RF) amplitude converter apparatus, comprising:
   a plurality of N switches, each switch having an input and an output, said switches adapted to generate an RF output signal;
   a plurality of N AND gates, each gate having a first input, second input and an output, wherein each switch having one of said gates associated therewith, the first input of each gate coupled to an input signal and the output of each gate coupled to the input of a respective switch associated therewith;

a plurality of N amplitude control signals, wherein the second input of each gate coupled to respective one of said amplitude control signals; and wherein N equals 64.

18. A digital to radio frequency (RF) amplitude converter apparatus, comprising:
a plurality of N switches, each switch having an input and an output, said switches adapted to generate an RF output signal;
a plurality of N AND gates, each gate having a first input, second input and an output, wherein each switch having one of said gates associated therewith, the first input of each gate coupled to an input signal and the output of each gate coupled to the input of a respective switch associated therewith;
a plurality of N amplitude control signals, wherein the second input of each gate coupled to respective one of said amplitude control signals; and
wherein N equals 1024.

19. A digital to radio frequency (RF) amplitude converter apparatus, comprising:
a plurality of N switches, each switch having an input and an output, said switches adapted to generate an RF output signal;
a plurality of N AND gates, each gate having a first input, second input and an output, wherein each switch having one of said gates associated therewith, the first input of each gate coupled to an input signal and the output of each gate coupled to the input of a respective switch associated therewith;
a plurality of N amplitude control signals, wherein the second input of each gate coupled to respective one of said amplitude control signals; and
wherein N is a positive integer and wherein said amplitude control signals are adapted to apply predistortion, filtering and amplitude modulation to an input signal.

20. The apparatus according to claim 13, further comprising a matching network having an input and an output, the output of said switches connected in parallel to the input of said matching network.

21. A digital to radio frequency (RF) amplitude converter apparatus, comprising:
a plurality of N switches, each switch having an input and an output, said switches adapted to generate an RF output signal;
a plurality of N AND gates, each gate having a first input, second input and an output, wherein each switch having one of said gates associated therewith, the first input of each gate coupled to an input signal and the output of each gate coupled to the input of a respective switch associated therewith;
a plurality of N amplitude control signals, wherein the second input of each gate coupled to respective one of said amplitude control signals, wherein N is a positive integer;
a matching network having an input and an output, the output of said switches connected in parallel to the input of said matching network; and
wherein said output of said matching network is coupled to an external power amplifier and antenna.

22. The apparatus according to claim 13, adapted to be implemented in an Application Specific Integrated Circuit (ASIC).

23. The apparatus according to claim 13, adapted to be implemented in a Field Programmable Gate Array (FPGA).

24. A transmit buffer, comprising:
a plurality of N output devices arranged in a parallel array;
a plurality of N pass-gates coupled to said N output devices, each pass-gate associated with one of said output devices, each pass-gate adapted to perform an AND function of a transmit chain signal and one bit of an N-bit amplitude control word;
a matching network coupled to the output of each said output device and adapted to generate a radio frequency (RF) output signal having amplitude determined in accordance with said amplitude control word; and
wherein N is a positive integer.

25. The transmit buffer according to claim 24, further comprising N isolation devices, each isolation device coupled to the output of a pass-gate and the input of an output device, said isolation device adapted to minimize coupling of said transmit chain signal to the RF output signal for output devices in an off state.

26. The transmit buffer according to claim 24, wherein each said output device comprises a semiconductor device.

27. The transmit buffer according to claim 24, wherein each said output device comprises a metal oxide semiconductor (MOS) device having a gate, drain and source, the output of each gate coupled to the gate of an MOS device.

28. The transmit buffer according to claim 24, wherein each pass-gate comprises a low noise, high isolation complimentary metal oxide semiconductor (CMOS) transmission gate controlled by a select signal resulting in the implementation of an AND function.

29. The transmit buffer according to claim 24, wherein N equals 64.

30. The transmit buffer according to claim 24, wherein N equals 1024.

31. The transmit buffer according to claim 24, wherein said amplitude control word is adapted to apply predistortion, filtering and amplitude modulation to said transmit chain signal.

32. The transmit buffer according to claim 24, wherein said RF output signal is coupled to an external power amplifier and antenna.

33. The transmit buffer according to claim 24, adapted to be implemented in an Application Specific Integrated Circuit (ASIC).

34. The transmit buffer according to claim 24, adapted to be implemented in a Field Programmable Gate Array (FPGA).

35. A transmit buffer, comprising:
an array of N parallel metal oxide semiconductor (MOS) devices, each MOS device having a gate, drain and source, said array adapted to generate a radio frequency (RF) output signal;
a plurality of N AND gates, each associated with an MOS device and adapted to perform an AND function between a transmit signal and one bit of an N-bit amplitude control word;
means for controlling the number of MOS devices whose gate is active in accordance with the number of active bits of said amplitude control word, wherein the number of MOS devices whose gate is active determines the output power of said array;
N isolation devices, each isolation device coupled to an output of one of the gates and an input of one of the MOS devices, said isolation device adapted to minimize coupling of said transmit signal to the RF output signal for MOS devices in an off state; and
wherein N is a positive integer.

36. The transmit buffer according to claim 35, wherein each AND gate comprises a low noise, high isolation complimentary metal oxide semiconductor (CMOS) transmission gate controlled by a select signal resulting in the implementation of an AND function.

37. A transmit buffer, comprising:
- an array of N parallel metal oxide semiconductor (MOS) devices, each MOS device having a gate, drain and source, said array adapted to generate a radio frequency (RF) output signal;
- a plurality of N AND gates, each associated with an MOS device and adapted to perform an AND function between a transmit signal and one bit of an N-bit amplitude control word;
- means for controlling the number of MOS devices whose gate is active in accordance with the number of active bits of said amplitude control word, wherein the number of MOS devices whose gate is active determines the output power of said array; and
- wherein N equals 64.

38. A transmit buffer, comprising:
- an array of N parallel metal oxide semiconductor (MOS) devices, each MOS device having a gate, drain and source, said array adapted to generate a radio frequency (RF) output signal;
- a plurality of N AND gates, each associated with an MOS device and adapted to perform an AND function between a transmit signal and one bit of an N-bit amplitude control word;
- means for controlling the number of MOS devices whose gate is active in accordance with the number of active bits of said amplitude control word, wherein the number of MOS devices whose gate is active determines the output power of said array; and
- wherein N equals 1024.

39. A transmit buffer, comprising:
- an array of N parallel metal oxide semiconductor (MOS) devices, each MOS device having a gate, drain and source, said array adapted to generate a radio frequency (RF) output signal;
- a plurality of N AND gates, each associated with an MOS device and adapted to perform an AND function between a transmit signal and one bit of an N-bit amplitude control word;
- means for controlling the number of MOS devices whose gate is active in accordance with the number of active bits of said amplitude control word, wherein the number of MOS devices whose gate is active determines the output power of said array; and
- wherein N is a positive integer and wherein said amplitude control word is adapted to apply predistortion, filtering and amplitude modulation to said transmit signal.

40. A transmit buffer, comprising:
- an array of N parallel metal oxide semiconductor (MOS) devices, each MOS device having a gate, drain and source, said array adapted to generate a radio frequency (RF) output signal;
- a plurality of N AND gates, each associated with an MOS device and adapted to perform an AND function between a transmit signal and one bit of an N-bit amplitude control word;
- means for controlling the number of MOS devices whose gate is active in accordance with the number of active bits of said amplitude control word, wherein the number of MOS devices whose gate is active determines the output power of said array; and
- wherein N is a positive integer and wherein said RF output signal is coupled to an external power amplifier and antenna.

41. The transmit buffer according to claim 35, adapted to be implemented in an Application Specific Integrated Circuit (ASIC).

42. The transmit buffer according to claim 35, adapted to be implemented in a Field Programmable Gate Array (FPGA).

43. A transmit buffer, comprising:
- controllable switch array comprising a plurality of switches and a plurality of AND gates, each AND gate associated with a switch and adapted to perform an AND function between an input clock signal and one bit of amplitude control word, said switch array operative to generate a radio frequency (RF) output signal;
- means for controlling the number of switches active in accordance with the number of active bits of said amplitude control word, wherein the number of switches active at any one time determines the output power of said switch array;
- plurality of buffers, each buffer adapted to generate an input clock signal; and
- wherein said switch array is partitioned into a plurality of sub-arrays, each sub-array driven by one of said buffers, wherein only buffers required for a particular code are turned on, unused buffers remaining off thus minimizing RF carrier feedthrough.

44. The transmit buffer according to claim 43, wherein said switch array is split into binary partitions.

45. The transmit buffer according to claim 43, wherein the size of said buffers varies in accordance with the particular binary group associated therewith.

46. The transmit buffer according to claim 43, further comprising means for switching between adjacent switches within said switch array so as to reduce device mismatch between adjacent codes.

47. The transmit buffer according to claim 43, further comprising means for switching between adjacent switches within said switch array to compensate for mismatches between transistors such that as the end of a row is reached, the transistor switching path continues with a subsequent row but in an opposite direction.

48. The transmit buffer according to claim 43, wherein said switch array comprises MSB cells and LSB cells, each MSB cell adapted to provide the power of a plurality of bits, thereby reducing carrier feedthrough and the total number of bits required for a given code.

49. The transmit buffer according to claim 48, wherein a number of LSB cells greater than that required for a particular resolution are used so as to average out transistor device mismatch between LSB transistor cells.

* * * * *